(12) United States Patent
Orschel et al.

(10) Patent No.: US 6,526,372 B1
(45) Date of Patent: Feb. 25, 2003

(54) METHOD AND DEVICE FOR DETERMINING THE DEPENDENCE OF A FIRST MEASURING QUANTITY ON A SECOND MEASURING QUANTITY

(75) Inventors: Benno Orschel, Salem, OR (US); Jan Helm, Berlin (DE); Bernd Srocka, Berlin (DE)

(73) Assignee: Aoti Operating Company, Inc., Bend, OR (US)

( * ) Notice: Subject to any disclaimer, the term of this patent is extended or adjusted under 35 U.S.C. 154(b) by 0 days.

(21) Appl. No.: 09/720,951

(22) PCT Filed: Jul. 2, 1999

(86) PCT No.: PCT/EP99/04617
§ 371 (c)(1),
(2), (4) Date: Apr. 18, 2001

(87) PCT Pub. No.: WO00/02058
PCT Pub. Date: Jan. 13, 2000

(30) Foreign Application Priority Data

Jul. 3, 1998 (DE) .......................................... 198 31 216

(51) Int. Cl.$^7$ .............................................. G01N 21/25
(52) U.S. Cl. ...................................... 702/189; 356/418
(58) Field of Search ........................... 702/189, 66, 75, 702/76, 77; 324/752; 438/16, 17; 356/418, 334

(56) References Cited

U.S. PATENT DOCUMENTS

| | | | | |
|---|---|---|---|---|
| 4,544,887 A | * | 10/1985 | Kamieniecki | 324/752 |
| 4,563,642 A | * | 1/1986 | Munakata et al. | 324/752 |
| 4,752,130 A | * | 6/1988 | George et al. | 356/334 |
| 4,971,439 A | * | 11/1990 | Brown | 356/319 |
| 5,140,701 A | * | 8/1992 | Zaks | 455/164.1 |
| 5,231,462 A | * | 7/1993 | Dschen | 356/328 |
| 5,434,666 A | * | 7/1995 | Carnahan et al. | 356/328 |
| 5,497,231 A | * | 3/1996 | Schmidt | 356/334 |
| 5,526,121 A | * | 6/1996 | Sandifer et al. | 356/418 |
| 6,069,017 A | * | 5/2000 | Kamieniecki et al. | 438/17 |
| 6,238,349 B1 | * | 5/2001 | Hickey | 600/486 |

* cited by examiner

Primary Examiner—Marc S. Hoff
Assistant Examiner—Edward Raymond
(74) Attorney, Agent, or Firm—Mallinckrodt & Mallinckrodt; Robert R. Mallinckrodt

(57) ABSTRACT

For determining the dependence of a first measuring quantity (Y) on a second measuring quantity (P) the second measuring quantity (P) is periodically modified with a frequency ($f_o$). The first measuring quantity (Y) changing accordingly is measured. From the obtained measuring signal of the first measuring quantity (Y) the components of the first measuring quantity (Y) are determined with at least a plurality of frequencies. From the components thus determined the first measuring quantity (Y) is reconstructed for at least a plurality of values of the second measuring quantity (P) by signal processing.

16 Claims, 4 Drawing Sheets

METHOD AND DEVICE FOR DETERMINING THE DEPENDENCE OF A FIRST MEASURING QUANTITY ON A SECOND MEASURING QUANTITY

BACKGROUND OF THE INVENTION

1. Field

The invention relates to a method for determining the dependence of a first measuring quantity on a second measuring quantity wherein (a) the second measuring quantity is periodically modified with a frequency and (b) the first measuring quantity changing accordingly is measured.

2. State of the Art

One example for the use of the invention is measuring the surface photo voltage of a material as first measuring quantity in dependence on the wavelength of the excitation light as second measuring quantity. When the surface of a semiconductor is exposed to light, a surface photo voltage is generated at the surface of the material, this surface photo voltage being a function of, inter alia, the diffusion length of the charge carriers in the material and being indicative thereof. The surface photo voltage is also a function of the wavelength of the excitation light. The longer the wavelength of the light, the higher is the transmission ability of the material for the light and the deeper penetrates the light into the material. The relationship between diffusion length and surface photo voltage is complicated. However, the relationship can be approximately linearized when operating either with constant intensity of the light or with constant output signal, that means when the measurement is operated at defined operating points. The measurement of the surface photo voltage can be used for detecting irregularities of the material, for example of a semiconductor wafer. For this purpose the surface photo voltage of the material is investigated point by point throughout the surface of the material.

Through EP-A-0 077 021 an apparatus is known for nondestructively measuring characteristics of a semiconductor wafer by means of a SPV-method. The wafer is irradiated by a pulsated light beam from a light source. The pulse frequency of the light beam is changeable by means of an oscillator. The light beam generates a photo voltage at the surface of the wafer. This photo voltage is picked up by capacitance coupling by an electrode. For noise suppression the photo voltage picked up by capacitance coupling is amplified by an lock-in amplifier. Through a signal processing unit the frequency of the oscillator (and thus the pulse frequency of the light beam) is determined and monitored. Furthermore, the signal processing unit determines the measured photo voltage in dependence on the pulse frequency. The pulse frequency is continuously increased and the photo voltage is measured. log $V_{ph}$ is shown as a function of log f at a display. At a critical frequency the dependence of the photo voltage on the pulse frequency changes in a characteristic manner. This critical frequency is indicative of the carrier lifetime to be measured, the carrier being generated by the light beam.

U.S. Pat. No. 5,663,657 also discloses a SPV-method for investigating a semiconductor wafer, in which the diffusion length of minority carrier is determined. A region of the wafer is exposed to light of different wavelength in several steps and the resulting photo voltage is measured. The photo voltage is determined as a function of the penetration depth of the excitation light, the penetration depth being a function of the wavelength of the light.

SUMMARY OF THE INVENTION

The surface photo voltages are very small and subject to strong noise. Therefore, the measuring is effected by means of a "lock-in" technique. The intensity of the excitation light is modulated with a modulation frequency and modulation phase. This results in a corresponding modulation of the measuring signal, as far as this results from the excitation by the light. By Fourier transformation of the measuring signal the component of the measuring signal is determined, which component, with regard to the frequency and the phase, corresponds to the modulation frequency and the modulation phase. Thus, the noise is suppressed such that even a very weak signal can be detected. Then the measurement is carried out for each investigated point of the material at various wavelength of the excitation light.

This measuring method takes very long time. When using the lock-in technique, a certain number of periods of the modulation frequency, for example five, is required for each measurement. The modulation frequency is limited by the material: When exposed to light, it takes a certain time before a state of equilibrium is reached in the material and a measurement of the surface photo voltage is useful. When the measurement then has to be carried out for each scanned point of the surface at various wavelengths and many points of the surface are to be scanned, this results in a measuring time which is intolerably long. Thus, in practice, when testing semiconductor wafers by surface photo voltage, only a very restricted number of measuring points are measured at a very restricted number of wavelengths.

It is the object of the invention to reduce the measuring time in these cases and in the case of methods for determining the dependence of a first measuring quantity (Y) on a second measuring quantity (P), which methods have similar problems, noise being suppressed as well.

According to the invention this object is achieved in a method of the above mentioned type in that (c) from the obtained measuring signal of the first measuring quantity the components of the first measuring quantity are determined with at least a plurality of frequencies and (d) from the components thus determined the first measuring quantity is reconstructed for at least a plurality of values of the second measuring quantity by signal processing.

Regarding the example of the surface photo voltage, thus, according to the invention, a modulation of the excitation light is not effected at a predetermined wavelength, which leads to a modulation of the surface photo voltage as "first measuring quantity". The wavelength of the excitation light is rather varied as "second measuring quantity" periodically throughout a scanning range with a frequency $f_0$. This results in a periodical measuring signal. The component of the frequency $f_0$ and the higher harmonics $2f_0$, $3f_0$ ... up to an upper limit frequency $Nf_0$ are obtained from this measuring signal. This also suppresses noise. Then, by inverse Fourier transformation, the first measuring quantity (for example surface photo voltage), then free from noise, can be reconstructed from the thus determined components in dependence on the second measuring quantity (for example wavelength) for at least a plurality of values of the second measuring quantity.

The photon density of the excitation light as a function of the wavelength can be measured additionally and taken into account in the calculation. This photon density can possibly by measured once and being calibrated. However, a determination of the photon density and of its dependence on the wavelength can be repeated in certain time intervals, not necessarily with the modulation frequency. However, it is not necessary to bring this photon density physically to a constant value at the various measuring points and wavelengths.

A preferred device for carrying out the method is subject matter of claim 9.

Modifications of the invention are subject matter of the sub-claims.

THE DRAWINGS

Embodiments of the invention will now be described in greater detail with reference to the accompanying drawings.

DETAILED DESCRIPTION OF THE ILLUSTRATED EMBODIMENTS

Figure 1:
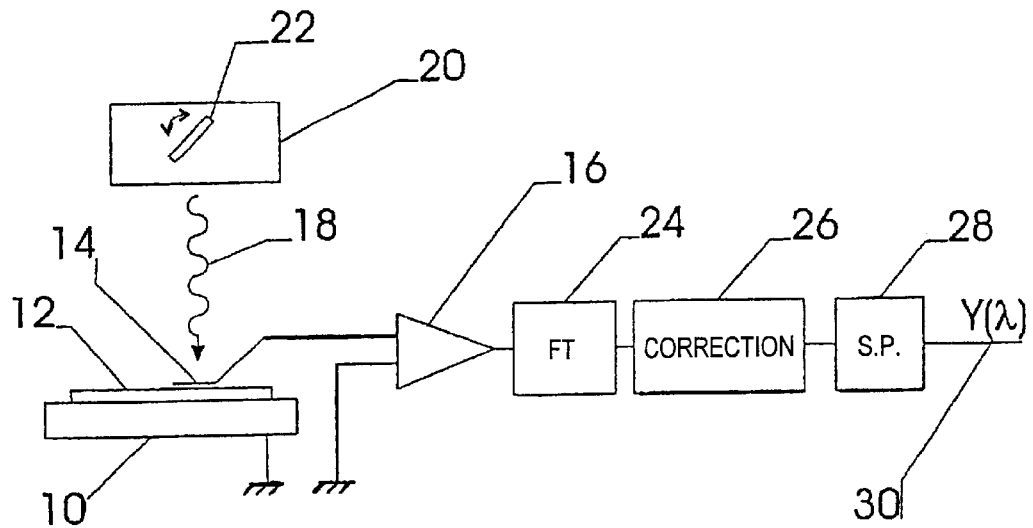
FIG. 1 is a schematic illustration of a device for measuring the dependence of a first measuring quantity (surface photo voltage) on a second measuring quantity (wavelength of the excitation light).

In FIG. 1 numeral 10 designates a sample table. A sample 12 of a semiconductor material, for example a semiconductor wafer, to be investigated is mounted on the sample table 10. A probe 14 serves for measuring the surface photo voltage SPV in the various measuring points of the surface of the sample. The probe 14 measures the surface photo voltage SPV relative to earth. The very weak signal is filtered and amplified by a signal preprocessing unit, which is illustrated here as amplifier 16.

Figure 6:
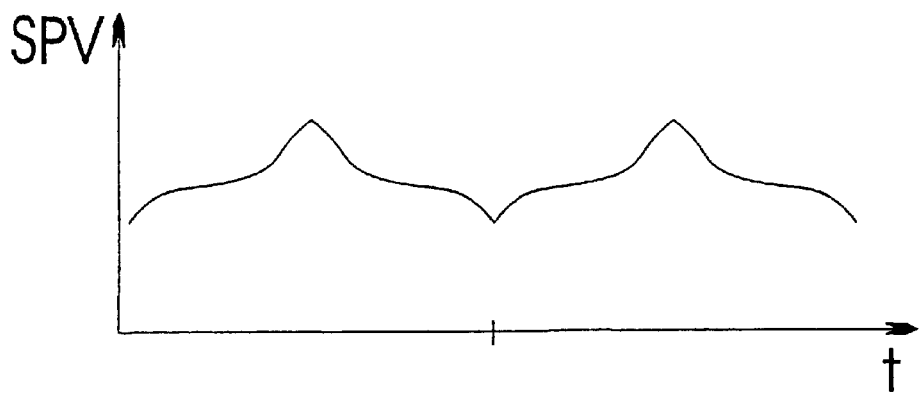
FIG. 6 is a schematic illustration of the measuring signal obtained with the device of FIG. 1.

For generating the surface photo voltage SPV an area on the surface of the material is illuminated by light. The light is indicated here by a light beam 18. The light is supplied by a monochromator 20. The monochromator 20 is provided with an optical member 22, for example an oscillating grating, oscillating harmonically with a frequency $f_0$. Thus, the wavelength $\lambda$ of the excitation light is varied periodically with this frequency $f_0$. The measuring signal thus obtained then approximately shows the course of time illustrated in FIG. 4. The measuring signal amplified by the amplifier 16 is applied to Fourier transformation means 24. These supply the Fourier transform of the measuring signal. This Fourier transform is corrected by correcting means 26 with respect to the frequency response and phase response of the amplifier 16. The dependence $Y(\lambda)$ of the first measuring quantity, that means the surface photo voltage SPV, on the second measuring quantity, that means the wavelength $\lambda$ of the excitation light, is obtained from this corrected Fourier transform by a signal processing unit 28. This dependence is applied to an output 30. The dependence thus obtained corresponds approximately to FIG. 6.

Figure 2:
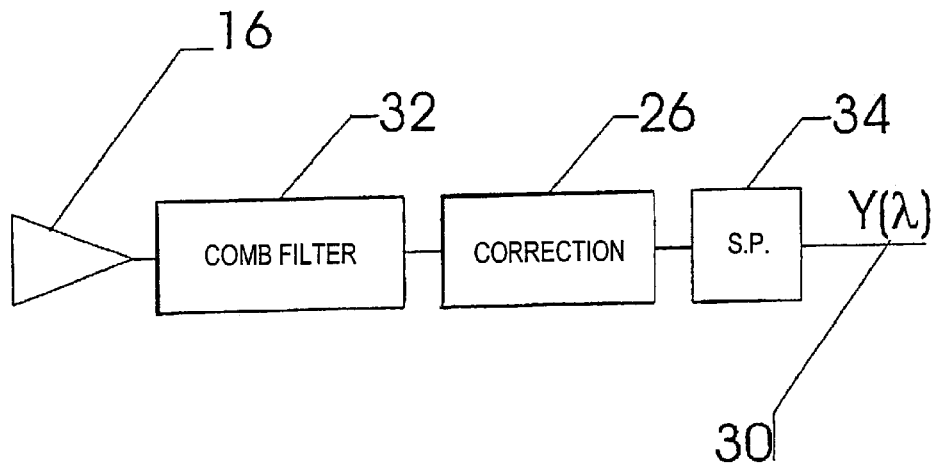
FIG. 2 is a schematic illustration of a modification of the device of FIG. 1 having a comb filter.
Figure 7:
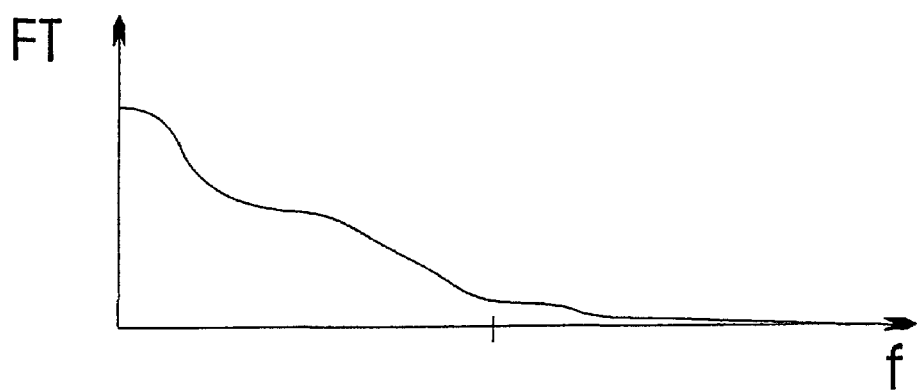
FIG. 7 shows the Fourier transform of the measuring signal of FIG. 4.
Figure 8:
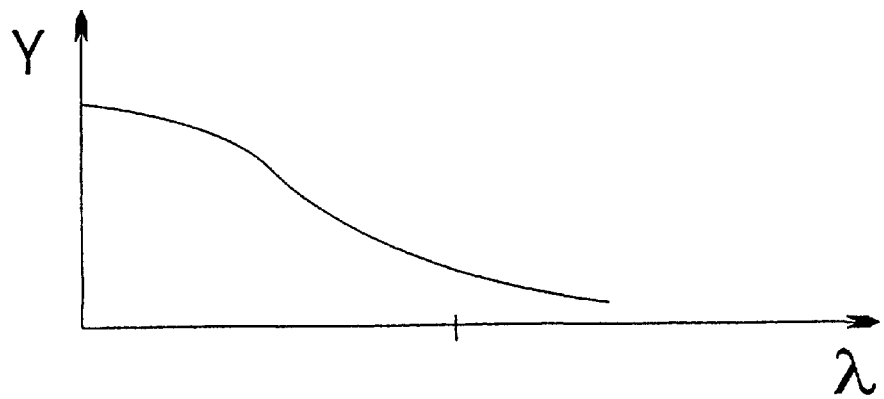
FIG. 8 shows schematically the dependence of the first measuring quantity Y (surface photo voltage) on the second measuring quantity P (wavelength of the excitation light) reconstructed from the Fourier transform of FIG. 5.
Figure 9:
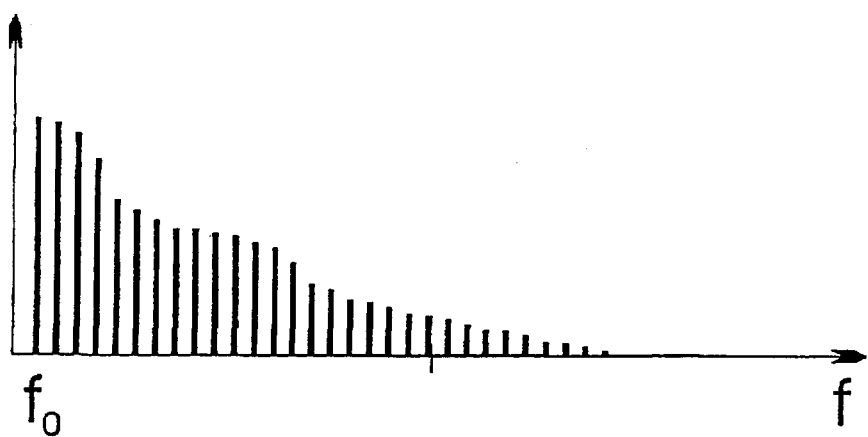
FIG. 9 shows schematically the components obtained by the modified measuring arrangement by means of the comb filter for various harmonic waves of the modulation frequency.
Figure 10:
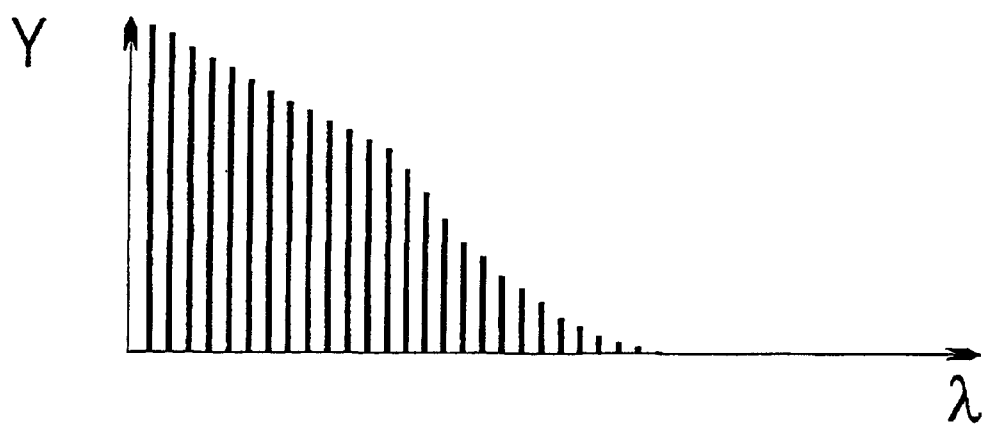
FIG. 10 shows schematically the values of the first measuring quantity (surface photo voltage) reconstructed therefrom for various values of the second measuring quantity (wavelength).

In the modification illustrated in FIG. 2 the measuring signal is applied to a comb filter 32. The comb filter 32 supplies, with high filter quality, the various components of the measuring signal (FIG. 4) with the modulation frequency $f_0$ and the harmonic waves $2f_0$, $3f_0$ etc. This is schematically illustrated in FIG. 7. From these components, values $Y_n$ of the first measuring quantity, for example the surface photo voltage, are determined for various discrete values $\lambda_n$ of the second measuring quantity A wavelength@ by means of a signal processing unit 34. This is illustrated in FIG. 8. FIG. 9 shows schematically the components obtained by the modified measuring arrangement by means of the comb filter for various harmonic waves oft he modulation frequency. FIG. 10 shows schematically the values of the first measuring quantity (surface photo voltage ) reconstructed therefrom for various values of the second measuring quantity (wavelength).

Figure 3:
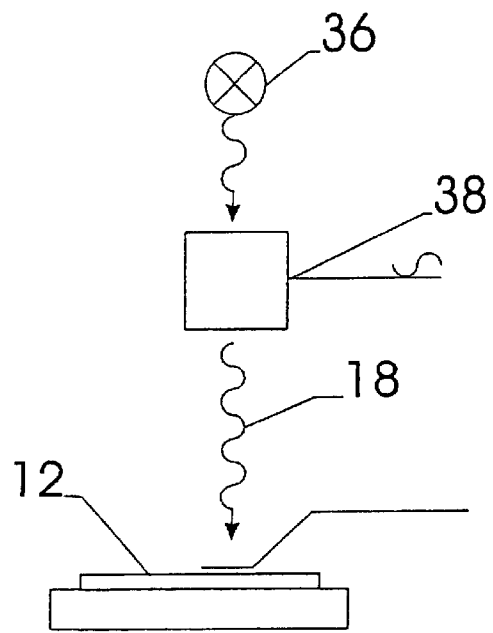
FIG. 3 shows a modification of the means for periodically varying the second measuring quantity, namely the wavelength of the excitation light.

In the modification of the measuring arrangement of FIG. 3 the excitation light having periodically variable wavelength is not generated by a monochromator having oscillating optical member as in FIG. 1. Rather there is provided a white light source 36, the light of which is guided through an acousto-optical transmission filter 38. The acousto-optical transmission filter 38 is controlled by a sine signal, by which the transmission range of the acousto-optical transmission filter is varied according to this signal. This results in a periodical sine-shaped modulation of the wavelength of the light.

Figure 4:
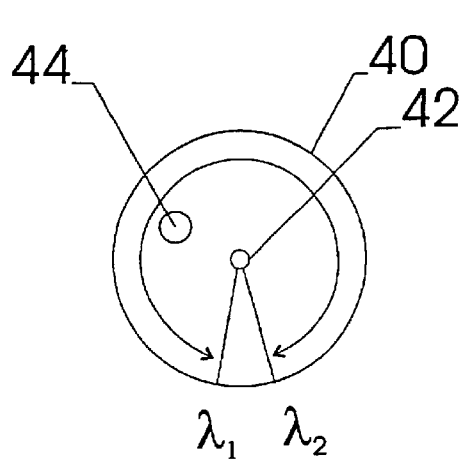
FIG. 4 shows a further modification of the means for periodically varying the wavelength, namely by means of a graduated filter.

FIG. 4 shows schematically an arrangement in which the wavelength of the excitation light is variable by means of a graduated filter. The graduated filter has a space-dependent transmission area. In the case of FIG. 4 the graduated filter is a disc 40 which is adapted to oscillate about an axis 42 as indicated by the double arrow. The transmissibility of the various sectors of the disc is a function of the circumferential angle. The transmissibility changes from the wavelength $\lambda_1$ over a circumferential area to a wavelength $\lambda_2$. With an oscillating movement these areas move from $\lambda_1$ to $\lambda_2$ relative to the beam of excitation radiation.

Figure 5:
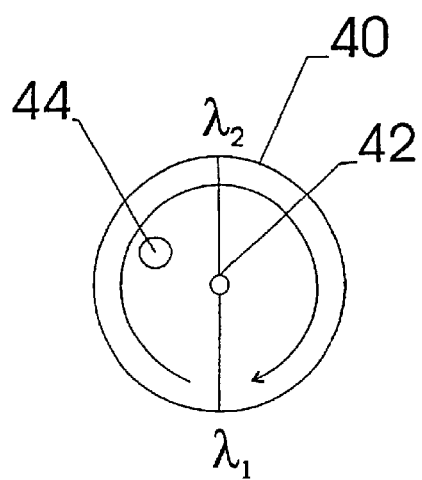
FIG. 5 shows a modification of the embodiment of FIG. 4.

In the embodiment of FIG. 5 the transmission areas changes over 180° to the right and to the left between the wavelengths $\lambda_1$ and $\lambda_2$. Then the disc 40 does not have to carry out an oscillating movement but can rotate continuously.

By moving the sample table the sample 12 can be moved relative to the probe 14 and to the light source 20, 22 and 36, 38, respectively, such that various points of the sample can be scanned consecutively.

Whereas the invention is here illustrated and described with reference to embodiments thereof presently contemplated as the best mode of carrying out the invention in actual practice, it is to be understood that various changes may be made in adapting the invention to different embodiments without departing from the broader inventive concepts disclosed herein and comprehended by the claims that follow.

What is claimed is:

1. A method of determining the dependence of a light-induced material characteristic, occurring at a location of a surface of a material when excited by excitation light having a wavelength and directed on said location, on said wavelength of said excitation light, comprising the steps of:
   cyclically varying said excitation light wavelength in a wavelength range at a wavelength variation frequency,
   measuring said light-induced material characteristic at said location as a function of said excitation light wavelength to obtain a signal waveform, as a function of time, cyclic at said variation frequency,
   providing harmonic components of said signal waveform of measured light-induced material characteristic v. time at, at least, a plurality of frequencies, and
   constructing, by signal processing from said components, a function representing the dependence of said light-induced material characteristic on said excitation light wavelength.

2. A method as claimed in claim 1, wherein said light-induced material characteristic is surface photo voltage.

3. A method as claimed in claim 1, wherein said excitation light wavelength is varied, within said wavelength range, in accordance to a sine function.

4. A method as claimed in claim 1, wherein said harmonic components are provided by subjecting said signal waveform of measured light-induced material characteristic v. time to a Fourier transform.

5. A method as claimed in claim 6, and further comprising the step of correcting said Fourier transform for frequency and response affecting said signal waveform of measured light-induced material characteristic v. time.

6. A method as claimed in claim 1, wherein the step of providing harmonic components of said signal waveform of measured light-induced material characteristic v. time comprises applying said light induced material characteristic to a comb filter.

7. A method as claimed in claim 1, the step of cyclically varying said excitation light wavelength in a wavelength range comprises:
   providing a monochromator having an element the position of which determines an output wavelength of said monochromator, and
   cyclically varying said output wavelength determining position.

8. A method as claimed in claim 1, wherein the step of cyclically varying said excitation light wavelength in a wavelength range comprises:
   passing a beam of white light through an acousto-optical transmission filter, and
   applying a sine-wave control signal to said acousto-optical transmission filter to vary the transmission wavelength range accordingly.

9. A method as claimed in claim 1, wherein the step of cyclically varying said excitation light wavelength in a wavelength range comprises: passing a beam of white light through a graduated transmission filter, and cyclically displacing said graduated transmission filter relative to said beam.

10. A device determining the dependence of a light-induced material characteristic, occurring at a location of a surface of a material when excited by excitation light having a wavelength and directed on said location, on said wavelength of said excitation light, comprising:
    means for cyclically varying said excitation light wavelength in a wavelength range at a wavelength variation frequency,
    means for measuring said light-induced material characteristic at said location as a function of said excitation light wavelength to obtain a signal waveform, as a function of time, cyclic at said variation frequency,
    means for providing harmonic components of said waveform of measured light-induced material characteristic v. time at, at least, a plurality of frequencies, and
    signal processing means for constructing, from said components, a function representing the dependence of said light-induced material characteristic on said excitation light wavelength.

11. A device as claimed in claim 10, wherein said light-induced material characteristic is surface photo voltage.

12. A device as claimed in claim 10, wherein said means for cyclically varying said excitation light wavelength comprise
    a monochromator having an element the position of which determines an output wavelength of said monochromator, and
    means for cyclically varying said output wavelength determining position.

13. A device as claimed in claim 12, wherein said means for providing harmonic components of said signal waveform of measured light-induced material characteristic v. time comprise Fourier transform means for subjecting said signal waveform of measured light-induced material characteristic v. time to a Fourier transform.

14. A device as claimed in claim 13, and further comprising means for correcting said Fourier transform for frequency and response affecting said signal waveform of measured light-induced material characteristic v. time.

15. A device as claimed in claim 10, wherein said means for providing harmonic components of said signal waveform of measured light-induced material characteristic v. time comprise means for applying said light induced material characteristic to a comb filter.

16. A device as claimed in claim 10, wherein said means for cyclically varying said excitation light wavelength in a wavelength range comprises:
    a graduated transmission filter,
    light source means for generating a beam of white light,
    means for passing said beam of white light through said graduated transmission filter, and
    means for cyclically displacing said graduated transmission filter relative to said beam.

* * * * *